United States Patent
Dalebroux et al.

(10) Patent No.: US 11,916,302 B2
(45) Date of Patent: Feb. 27, 2024

(54) PHASED ARRAY OVER THE AIR TESTING

(71) Applicant: Tektronix, Inc., Beaverton, OR (US)

(72) Inventors: Donald J. Dalebroux, Vernonia, OR (US); Amr Haj-Omar, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 125 days.

(21) Appl. No.: 17/541,175

(22) Filed: Dec. 2, 2021

(65) Prior Publication Data

US 2022/0173510 A1     Jun. 2, 2022

Related U.S. Application Data

(60) Provisional application No. 63/120,689, filed on Dec. 2, 2020.

(51) Int. Cl.
    *H01Q 3/34*         (2006.01)
    *G01R 29/08*      (2006.01)
             (Continued)

(52) U.S. Cl.
    CPC ........... *H01Q 3/34* (2013.01); *G01R 29/0892* (2013.01); *H01Q 3/267* (2013.01); *G01R 29/10* (2013.01)

(58) Field of Classification Search
    CPC .... G01R 29/0892; G01R 29/10; H01Q 3/267; H01Q 3/34
             (Continued)

(56) References Cited

U.S. PATENT DOCUMENTS

| | | | |
|---|---|---|---|
| 6,236,363 B1* | 5/2001 | Robbins | H01Q 3/267 342/372 |
| 2002/0140600 A1* | 10/2002 | Utley | G01R 29/10 343/703 |
| 2005/0150278 A1* | 7/2005 | Troxler | G01N 33/38 73/78 |

(Continued)

OTHER PUBLICATIONS

United States Patent and Trademark Office's Commissioner for Patents, International Search Report and Written Opinion for International Application No. PCT/US2021/061670, dated Feb. 14, 2022, 11 pages, Alexandria, Virginia.

*Primary Examiner* — Tan H Trinh
(74) *Attorney, Agent, or Firm* — Miller Nash LLP; Andrew J. Harrington

(57) ABSTRACT

A test and measurement system includes a test and measurement device having input channels, a reference array of antennas connected to the input channels, one or more processors in the test and measurement device configured to execute code to cause the one or more processors to receive a first signal from a phased array of antennas connected to a device under test directed at a first side of the reference array, receive a second signal from the phased array of antennas connected to the device under test directed at a second side of the reference array, without moving the device under test, the phased array, or the reference array. A method of testing a device under test using a phased array of antennas includes tuning the phased array to a first location at a first side of a reference array of antennas, by adjusting a phase for each antenna in the phased array, receiving a first signal from the device under test at the first location, tuning the phased array to a second location at a second side of the reference array of antennas, and receiving a second signal from the device under test at the second location. A test and measurement device includes at least two input channels, an array of at least two reference antennas, each antenna (Continued)

connected to one of the input channels, one or more processors in the test and measurement device configured to execute code to cause the one or more processors to receive an input signal from one or more of the reference antennas, and measure the input signal from one or more of the reference antennas.

16 Claims, 10 Drawing Sheets

(51) Int. Cl.
*H01Q 3/26* (2006.01)
*G01R 29/10* (2006.01)

(58) Field of Classification Search
USPC .................................................. 455/67.11
See application file for complete search history.

(56) References Cited

U.S. PATENT DOCUMENTS

| | | | |
|---|---|---|---|
| 2011/0084887 A1* | 4/2011 | Mow | G01R 29/10 343/703 |
| 2011/0287728 A1 | 11/2011 | Kenington | |
| 2013/0093447 A1* | 4/2013 | Nickel | G01R 29/10 324/750.16 |
| 2016/0156100 A1 | 2/2016 | Raytheon | |
| 2016/0337052 A1 | 11/2016 | Keysight | |
| 2017/0016953 A1* | 1/2017 | Beer | G01R 27/28 |
| 2018/0337738 A1* | 11/2018 | Wen | H04B 17/309 |
| 2019/0049502 A1* | 2/2019 | Gerbl | H01Q 3/267 |
| 2019/0221938 A1* | 7/2019 | Kuroiwa | H01Q 9/27 |
| 2019/0302184 A1* | 10/2019 | Rowell | G01R 31/31903 |
| 2019/0348761 A1* | 11/2019 | Miehle | H01Q 21/29 |
| 2020/0091608 A1 | 3/2020 | Intel | |
| 2021/0265742 A1* | 8/2021 | Lee | G01R 29/10 |

* cited by examiner

PHASED ARRAY OVER THE AIR TESTING

RELATED APPLICATIONS

This disclosure claims benefit of U.S. Provisional Patent Application No. 63/120,689, titled "SYSTEM AND METHOD OF PHASED ARRAY OVER THE AIR TESTING USING A MULTICHANNEL OSCILLOSCOPE," filed Dec. 2, 2020, which is incorporated herein in its entirety.

TECHNICAL FIELD

This disclosure relates to testing devices using phased array antennas, more particularly to using testing apparatus having an array of reference antennas.

BACKGROUND

The use of millimeter wave (mm wave) frequency signals continues to grow. Signals at these frequencies have high path loss, resulting in the use of phase array antennas, also referred to as beamformers, to direct the EM (electromagnetic) energy from the transmitter to a particular point in space at which the signal is intended to be received. The signals may be radio frequency (RF) or optical. The process of beamforming often involves proprietary methods that need to be tested and tuned. Integration of the mm wave phase array antennas into the beamforming network to avoid cable losses makes cabled measurements impossible. This has necessitated measuring these beamformer/antenna networks over the air.

Typically, the beamformer IC (integrated circuit) and its integrated phased array antenna are pointed at a reference antenna connected to a test and measurement device such as a network analyzer or a spectrum analyzer. The current process adjusts the phase and amplitude of each of the element antennas of the phased array so that the signals all arrive at the same time. This requires that the device under test (DUT), the IC and the phased array, rotate 180 degrees to allow measurement of the beam pattern during rotation, each time the beam direction changes. This takes a lot of time and may lead to some inaccuracies if the DUT is not rotated precisely.

Embodiments of the disclosed apparatus and methods address shortcomings in the prior art.

DETAILED DESCRIPTION

Figure 1:
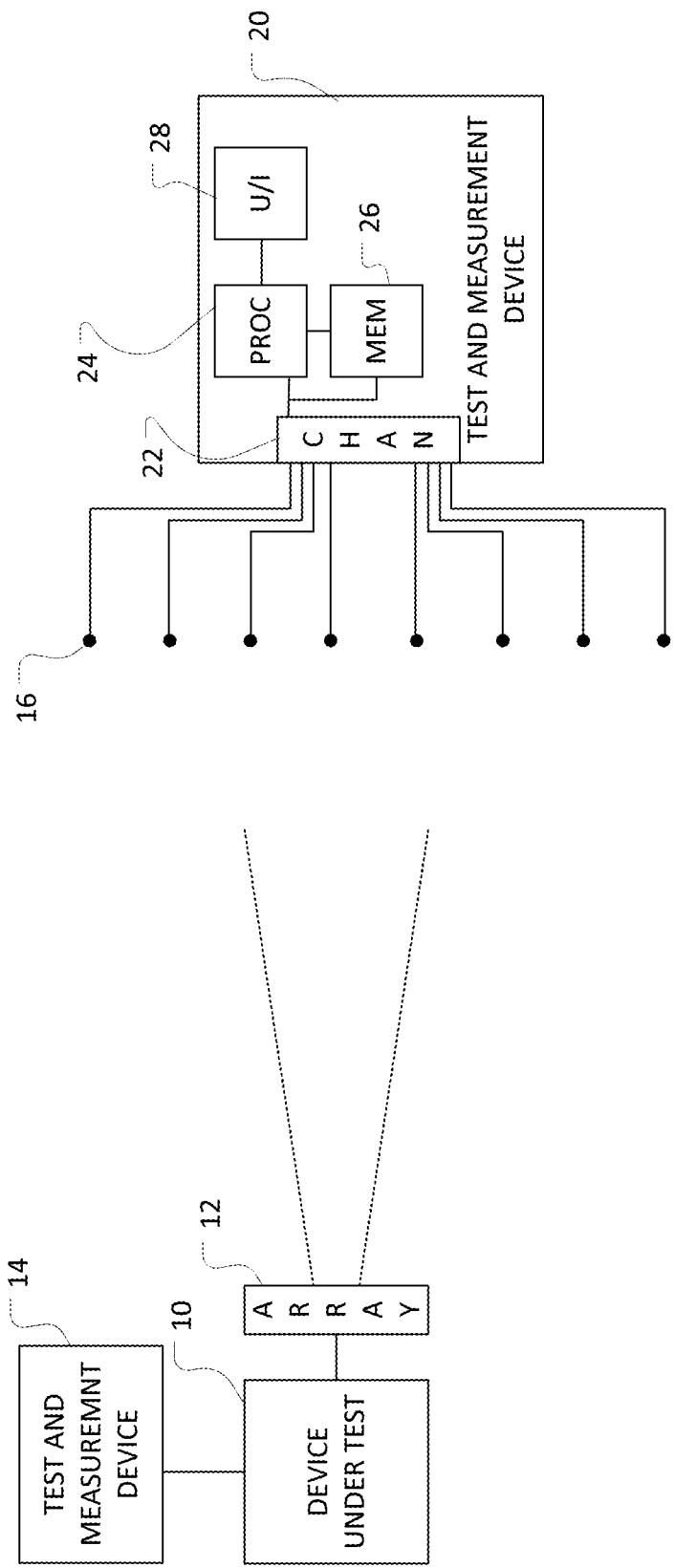
FIG. 1 shows an embodiment of a test and measurement system including an array of reference antennas.

This discussion uses several terms as defined here. The term "test and measurement device" means any piece of equipment used to test devices such as integrated circuits, circuit boards, etc., all of which will be referred to here as a "device under test (DUT)." The equipment may include, and is not limited to, oscilloscopes, including multi-channel and mixed signal (MSO) oscilloscopes, equipment that includes arbitrary waveform or waveform generators, analyzers, including spectrum, parameter, network, modulation analyzers, and multi-meters.

The term "phased array" means a phased array of antennas connected to a DUT, which may also be referred to as the device under test "having" a phased array. The term "reference array" and "reference antenna" refers to the antennas connected to a test and measurement device that receive signals from the phase array on the DUT. The phased array may be transmitting RF signals or optical.

Currently, testing millimeter wave technology occurs by using a phased array to aim a beam formed by a beamformer DUT at a single reference antenna, and then rotating the DUT 180 degrees to measure the beam pattern. Each change in beam direction to be tested results in having to rotate the DUT 180 degrees so the beam can be tuned and measured as it changes direction.

In contrast, the embodiments here uses multiple reference antennas patterned with equal spacing around the DUT. Instead of rotating the DUT, the system tunes the beam and measures it as it changes direction. Generally the tuning process will occur twice, once to the right and once to the left of a center point of an array, and the position to which beamformer phased array is tuned depends upon the arrangement of the reference antennas. The location to where the tuning occurs varies depending upon whether there is a boresight antenna.

If there is a boresight antenna, the locations to where the beamformer phased array is tuned lie halfway between the boresight antenna and the first antenna on either side. For example, if the antennas on either side are offset at a 20 degree angle from the boresight antenna, the locations would be 10 degrees from the boresight. An example of such a configuration could have three antennas in the array, one at boresight and one on each side for symmetry. There could be any number of antennas on each side, limited only by the number of channels on the test and measurement device. For example, for an 8-channel device the antenna array may have three, five or seven antennas, if symmetry on either side of the boresight is to be maintained. Multiple test and measurement devices may be used to provide more than 8 input channels, and therefore support more than 8 reference antennas. The multiple test and measurement devices may be synchronized to provide time alignment of the measured signals.

For arrays without a boresight antenna, such as two, four, six or eight antennas, the phased array would tune to the antennas on each side closest to the center point between the two center antennas. In either case, the beamformer will be tuned only slightly to each side of the array. This may be referred to here as "partial tuning." If it is over tuned, the process will not work as the pattern will change too much. This allows beamforming processes implemented by the beamforming DUTs to be tested and tuned.

FIG. 1 shows an embodiment of a test and measurement system to test beamforming algorithms generated by a beamformer DUT. The DUT 10 has a phased array of antennas 12, and may be connected to one or more test and measurement devices that can interact with the DUT and the array as needed. One should note that the test and measurement device 14 may comprise a computer, and while not shown, the test and measurement device 14 will typically comprise a device having the same or like components as the test and measurement device 20. The test and measurement device 14 may allow DUTs that comprise both transmitters and receivers to be tested and is therefore optional.

A test and measurement device 20 has an array of reference antennas such as antenna 16 connected to the input channels 22. The embodiment shown has 8 reference antennas, each connected to its own channel on the test and measurement device 20. Other numbers of antennas in the reference array may be used, FIG. 1 merely provides an example. Each reference antenna will typically connect to one input channel on the test and measurement device, so the limit of the number of reference antennas becomes limited only by the number of available channels.

The test and measurement device 20, in addition to the channels 22, will generally have one or more processors such as 24, configured to execute code that will cause the processors to perform certain tasks, a memory 26 to store the code and data resulting from the operation of the antenna array. The device 20 will include at least one user interface 28, which may comprises touch screen, a display, and user controls such as knobs and buttons.

Figure 2:
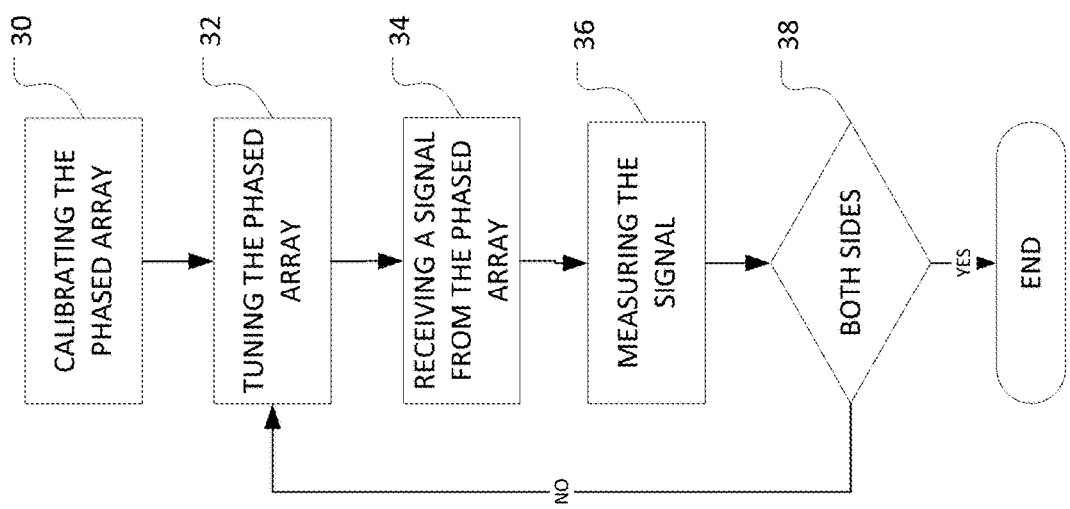

The below discussion documents an experiment that was performed using a reference antenna array of two horn antennas, with the understanding that the techniques discussed here apply to any number of reference antennas each of which can be connected to a different input channel of a test and measurement device such as an oscilloscope. A general embodiment for testing a beamformer DUT will be discussed along with the experimental results. FIG. 2 shows an embodiment of a method to test a beamformer DUT. One should note that in the system and methodology, the DUT performs part of the process. The DUT will comprise a beamformer IC or beamformer system on a board, and may be configured prior to the methodology to provide the various signals discussed below or may be under control of another device during the testing. The DUT may undergo configuration, programming and control using a test and measurement device connected to it as part of the system and shown in FIG. 1.

In the experiment, a 4× phased array antenna was connected to a beamformer IC and an upconverter. As discussed above, one may use more or fewer antennas in the phased array, this merely provides an example. An arbitrary waveform generator (AWG) generated a 2 GHz IF (intermediate frequency) signal that was upconverted to a 25 GHz 5G signal. The reference antennas were connected to different input channels of an oscilloscope.

Figure 4:
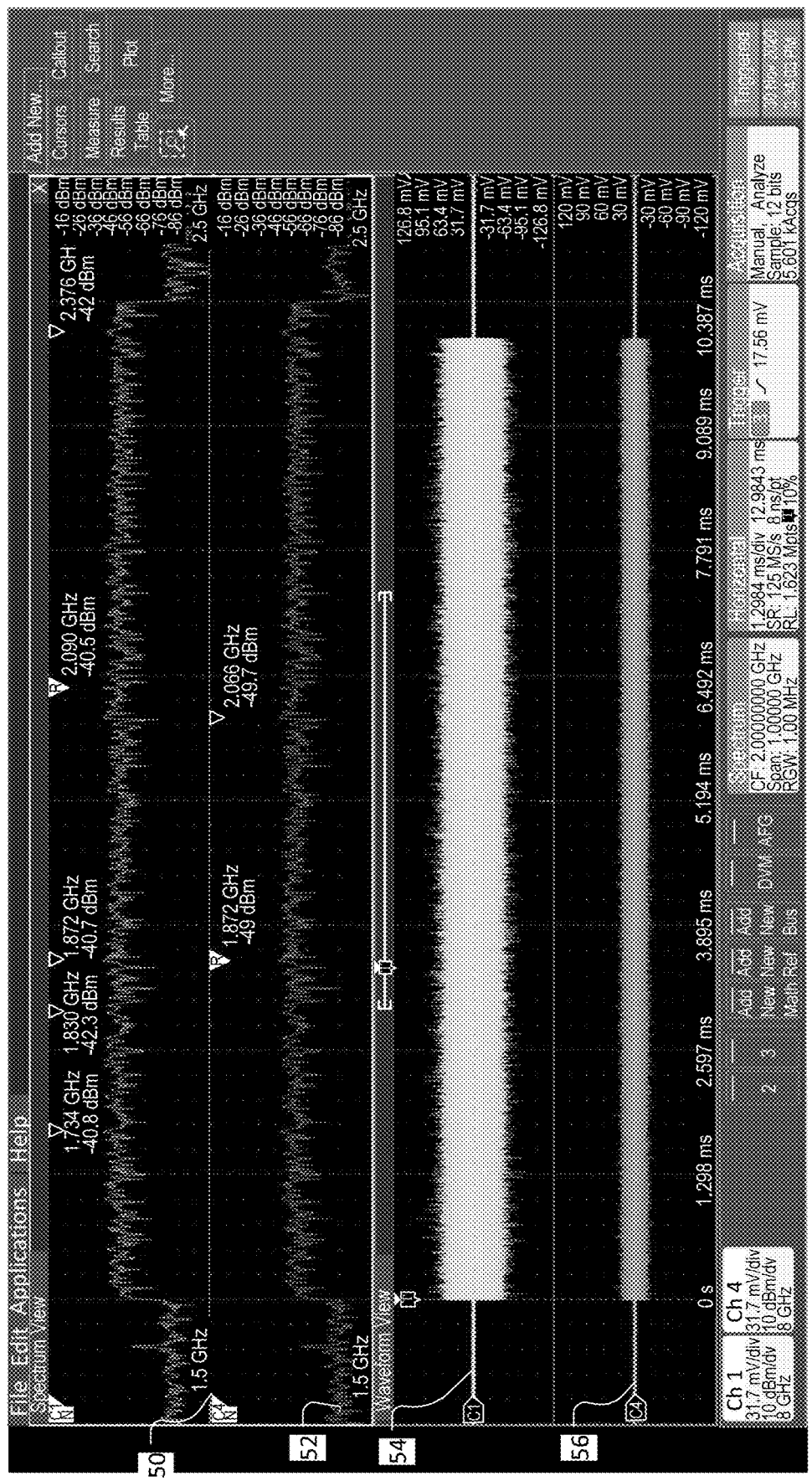
FIG. 4 shows an example of a waveform resulting from pointing a phased array of a device under test at a single reference antenna.

In this experiment, each horn reference antenna was connected to their own channel on an oscilloscope, and down converted back to 2 GHz. The reference antennas lay about 45 inches from the phased array and have 36 inches between them. Initially, regardless of the number of reference antennas, the beamformer DUT needs to be calibrated to the reference antennas as shown in FIG. 2 at 30. After initial calibration, it is possible one could test further DUTs using the same phased array, so calibration may not need to occur each time. In the experiment, the phased array was pointed directly at one of the reference antennas with the beamforming DUT setting all of the antennas in the phased array to zero phase. FIG. 4 shows the result.

The display will be common to all of the results. The top signal 50 shows the spectrum view for the first reference antenna, the second signal 52 shows the spectrum view of the second reference antenna. The third signal 54 shows the waveform view of the first reference antenna, and the fourth signal 56 shows the waveform view of the second reference antenna. This result can be used to verify the calibration by looking at the results at the first reference antenna later in the process.

Since the methods of the embodiments employ multiple antennas, the next step may involve locating the center point of the reference array, depending upon the configuration of the reference array, as discussed above. If there is an antenna at boresight, one can just position either the antenna or the DUT for maximum amplitude for calibration. If there is an antenna at boresight, to maintain symmetry, an even number of reference antennas would reside on either side of the boresight antenna. For an 8-channel test and measurement device, one may have the boresight antenna and three reference antennas on either side of it. If one desired to use all 8 channels of the 8-channel device, one could space four antennas one either side of the center point with no boresight antenna. Without a boresight antenna, the calibration would occur as below with equal amplitude and phase on the two antennas closest to the center point.

Figure 5:
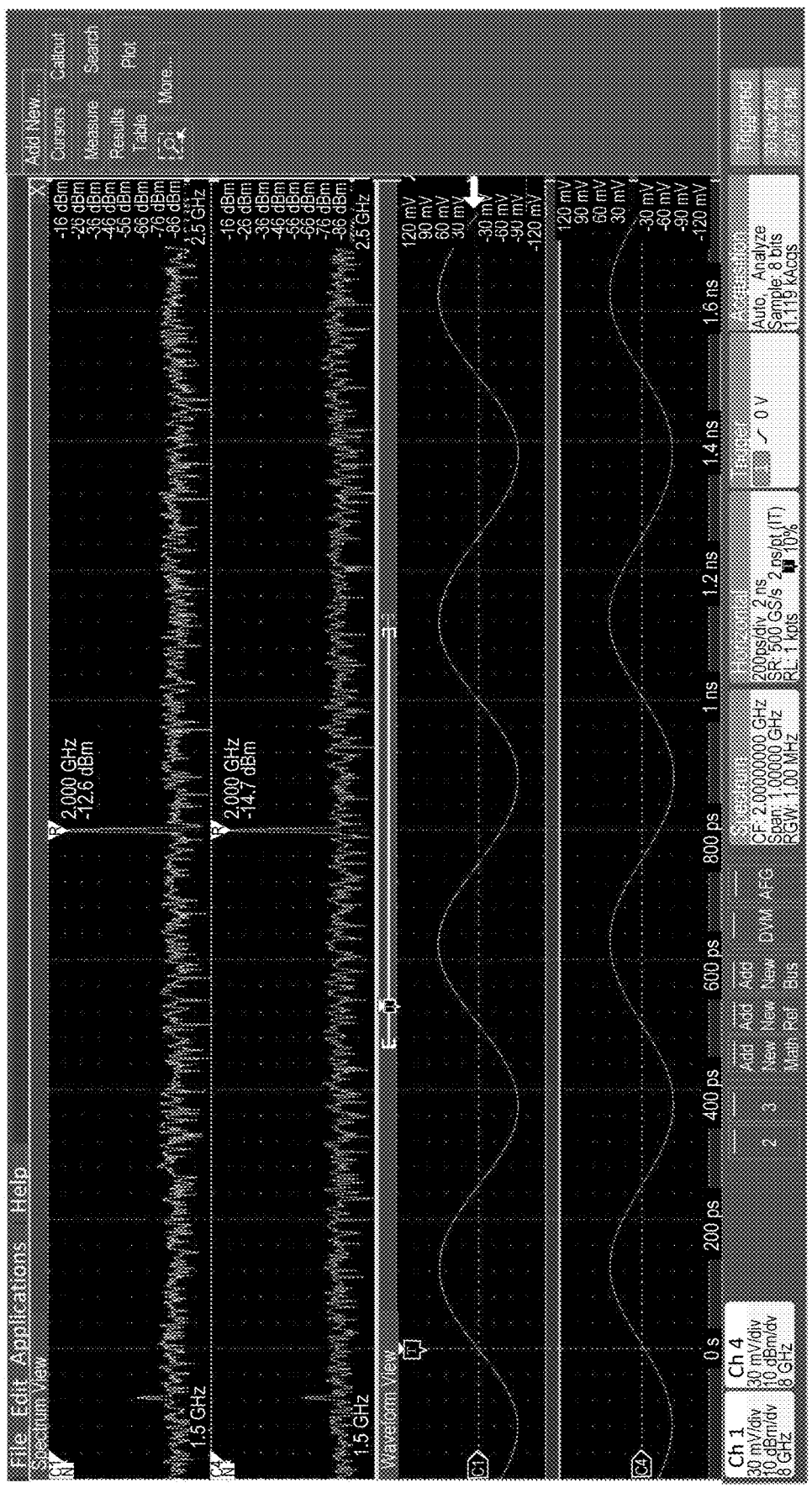
FIG. 5 shows an example of a waveform used to determine a center point of an array of reference antennas.
Figure 6:
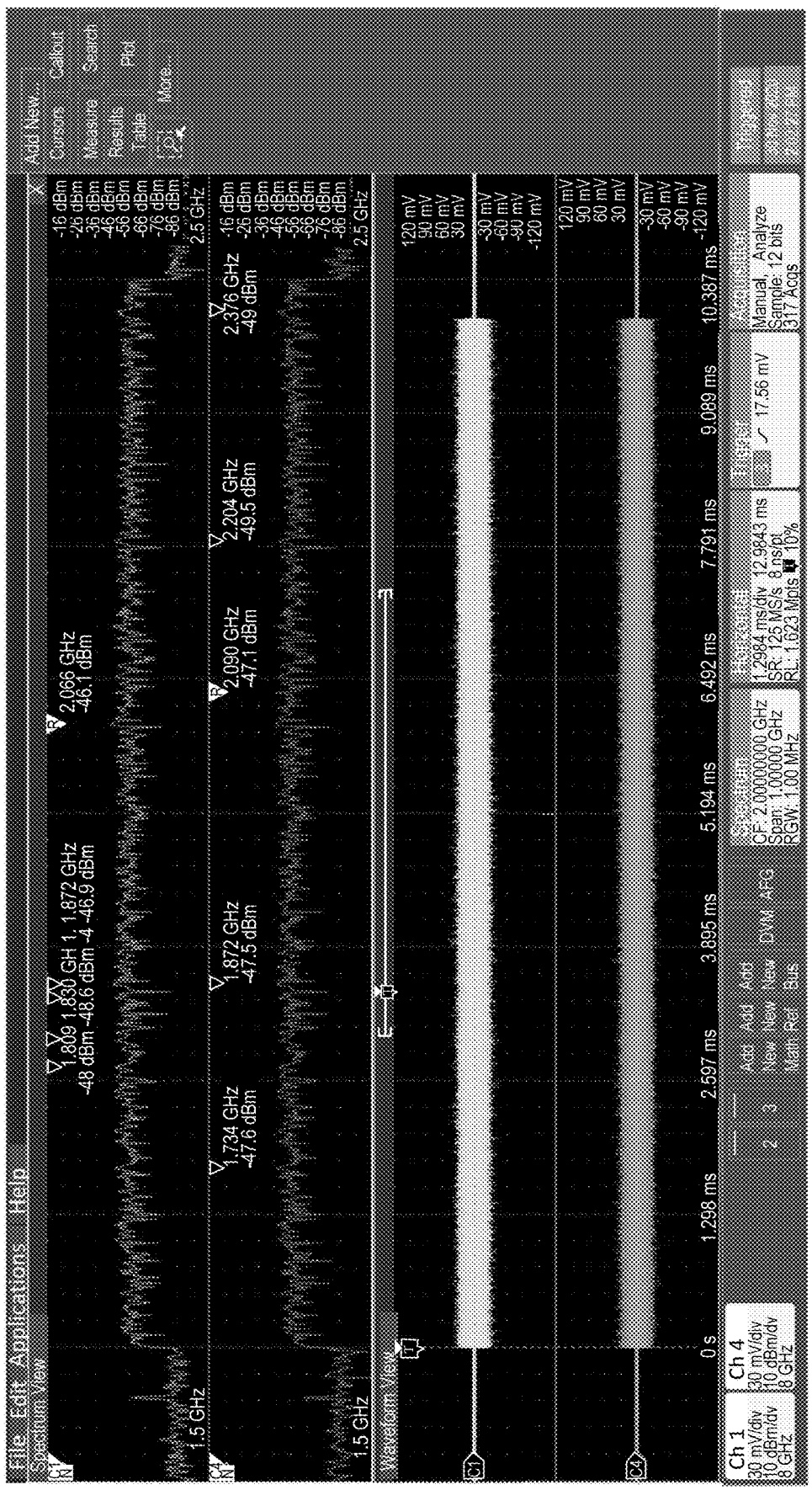
FIG. 6 shows an example of a waveform resulting from pointing a phased array at a center point of an array of reference antennas.

The DUT then transmits a calibration signal and the phased array is directed until the signal phase and amplitude shows the same at each reference antenna. In the experiment, a sine wave was used until the signals received at the two reference antennas matched phase and amplitude, as shown in FIG. 5. FIG. 6 shows the resulting signal when the DUT sends a 5G signal.

Figure 7:
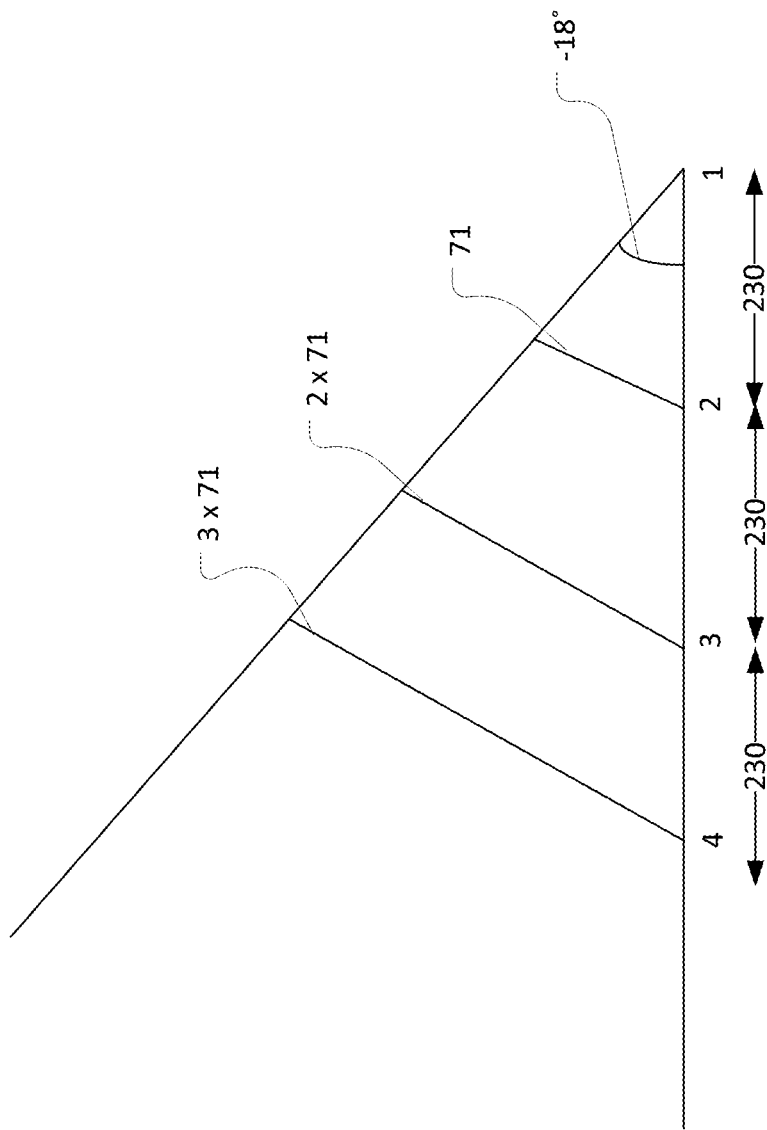
FIG. 7 shows a diagram used to determine the phase offsets for the antennas of the phased array in one example.

Prior to testing the beamformer, the phase adjustment needed to move the beam from the center point to the reference antennas. An example is shown in FIG. 7. For this particular experiment, the angle of arrival for a planar wave front relative to the plane of the array equals approximately 18 degrees. The hypotenuse of the triangle between antenna 1 and 2 is 230 mils, (½ wavelength at 25 GHz). From that, the base of the right triangle equals to be 71 mils or about 55.6 degrees. The beamformer used in the experiment adjusts in about 5.6 degree increments, so a phase setting of 10 equals about 56 degrees. Antenna 4 has the most delay so its phase is set to 0. The phase delay for antenna 3 is set to 10, antenna 2 to 20, and antenna 1 to 30.

Figure 8:
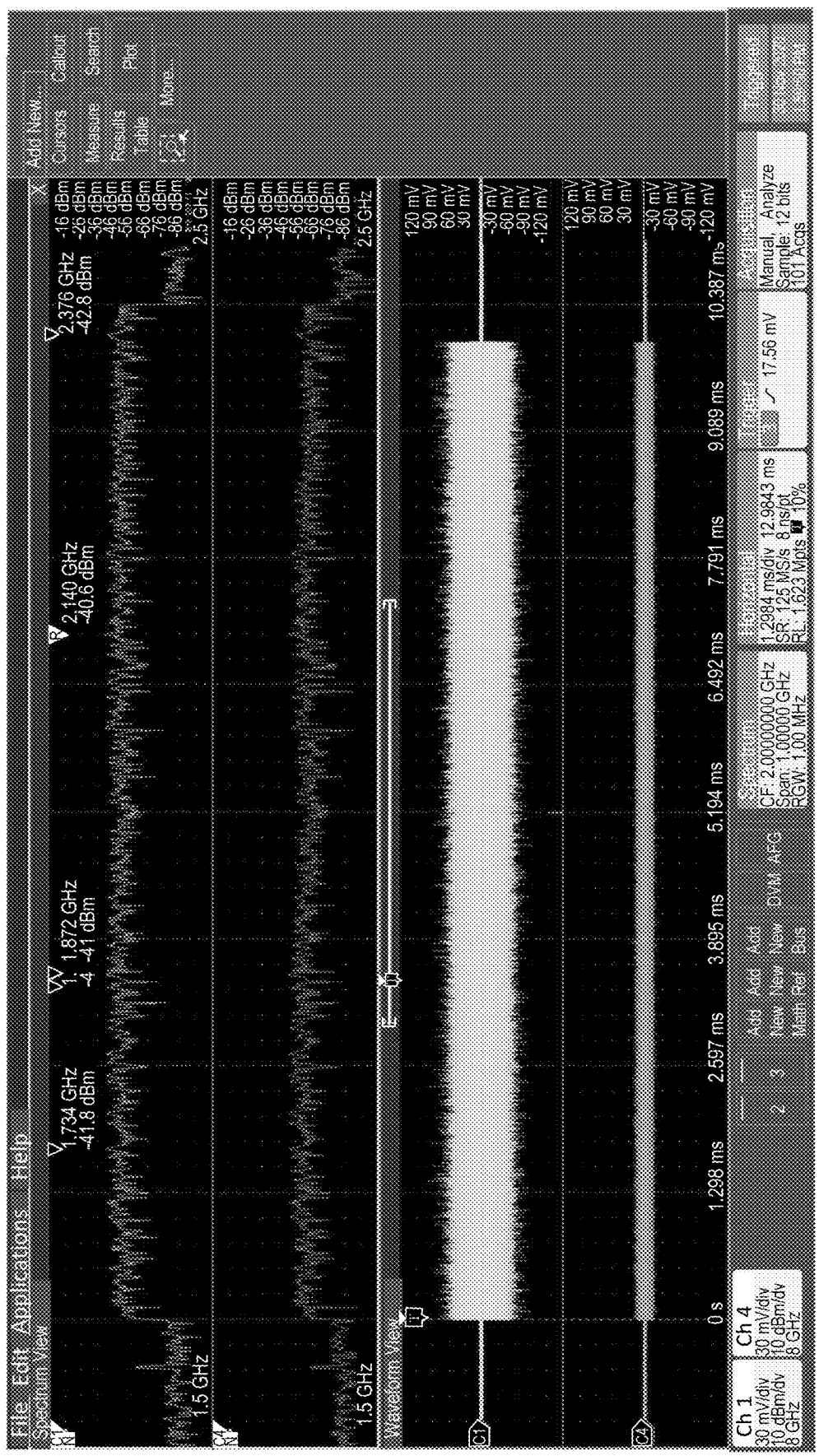
FIG. 8 shows an example of a waveform resulting from a phased array of a device under test tuned to a first reference antenna without moving the device under test.
Figure 9:
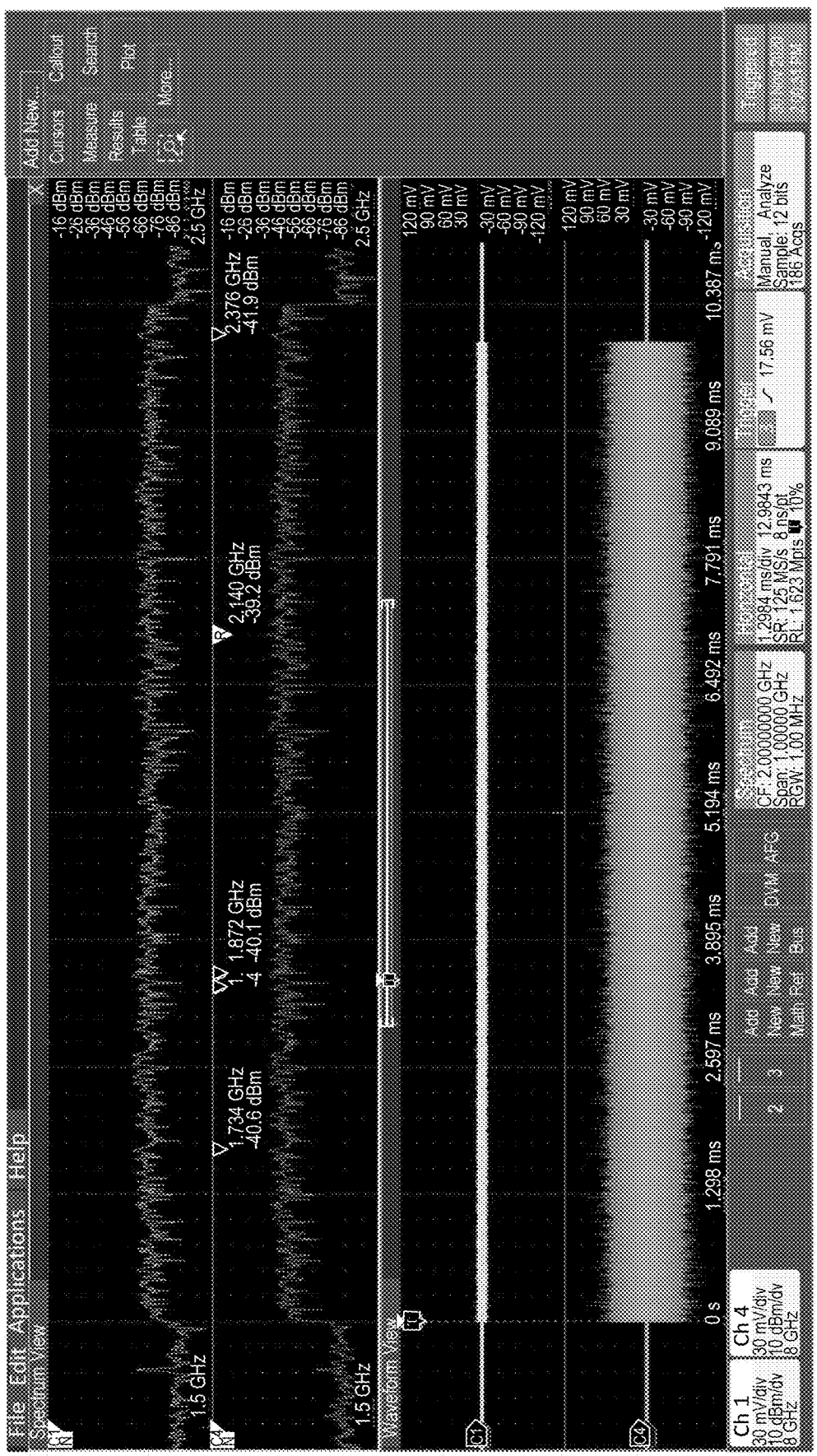
FIG. 9 shows an example of a waveform resulting from a phase array of a device under test tuned to a second reference antenna without moving the device under test.

In the experiment, an Analog Device beamformer IC, the ADMV4801, was used. It was programmed with the above phase offsets above for the right reference antenna. The left reference antenna will have the same values but transposed from antenna 1 to antenna 4. With the phased array set in place as was calibrated above, the beamformer was tuned to the left horn antenna, with the results shown in FIG. 8. Comparing FIG. 8 to the results in FIG. 4, one can see that the results match, with the phased array tuned but not moved from its position. FIG. 9 shows the results after the beamformer is tuned to the right horn. Again, these results occur from tuning the phased array, rather than rotating it to move through the various angles.

Figure 3:
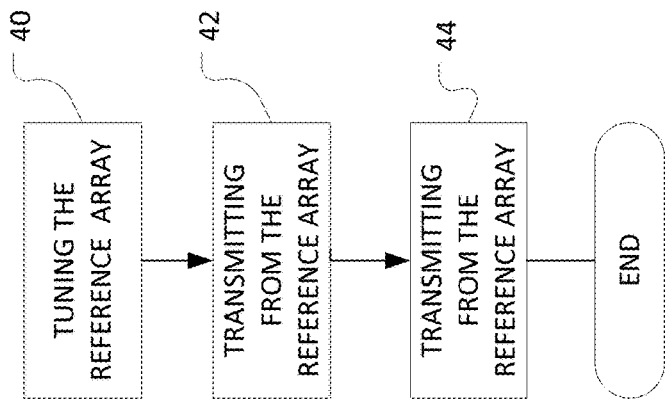
FIGS. 2-3 show flowcharts of embodiments of testing a device under test with an array of reference antennas.

Returning to FIG. 2, the tuning at 32, receiving at 34, and then measuring at 36, is repeated so that the beamformer has been tuned to both sides of the array of reference antennas at 38. FIG. 3 shows what is essentially this process in reverse to test the reception of at the DUT. The phase adjustments in this process are applied to tune the reference antennas at 40 and then the reference antennas transmits a signal to the phased array/DUT at 42. This may include measuring the signal received at the beamformer to test the DUTs reception capability.

In the experiment, the EVM (error vector magnitude), a measure of how accurately a wireless system is transmitting symbols within its constellation, for the phased array antenna equaled about 1.8%.

Figure 10:
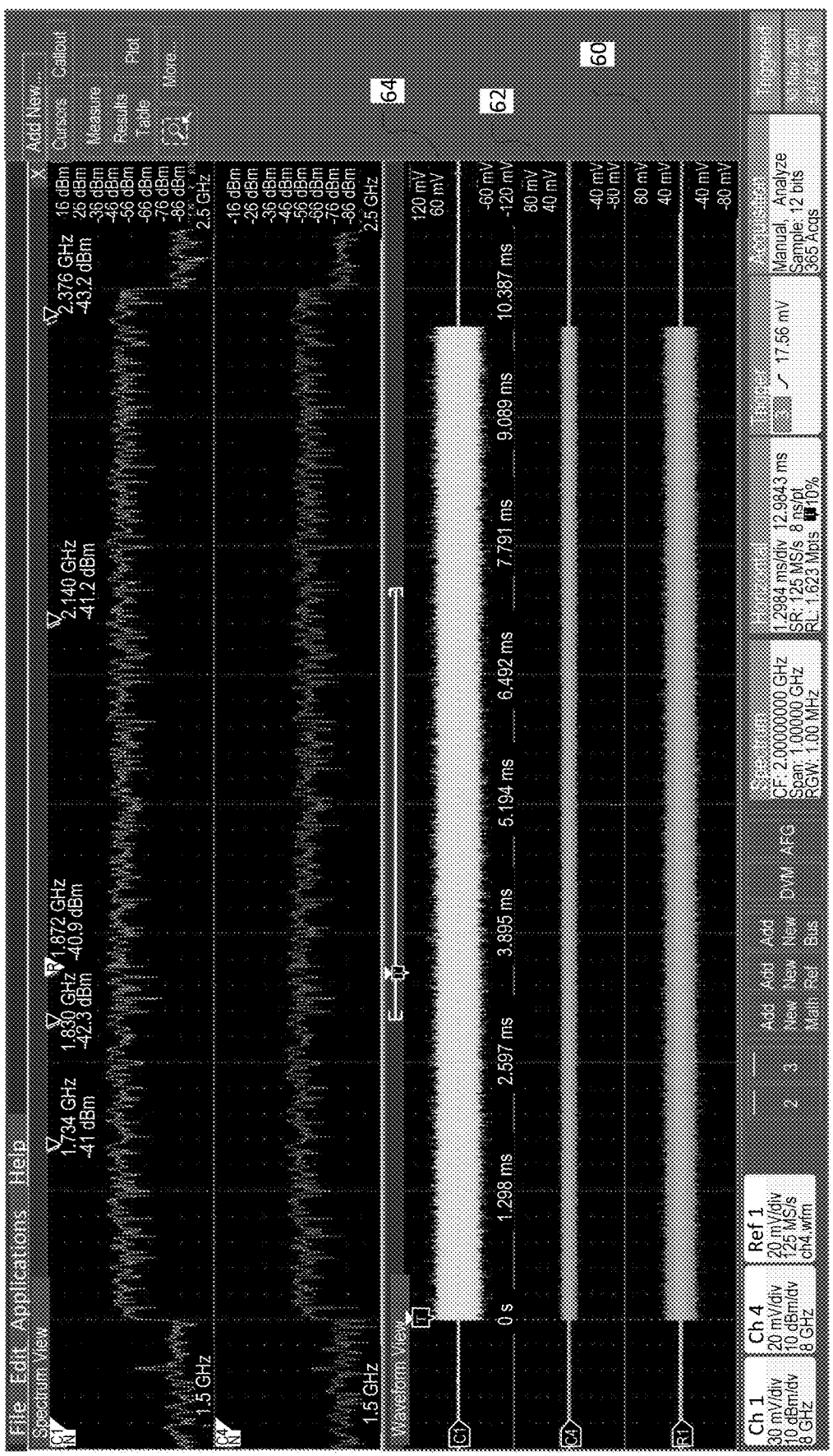
FIG. 10 shows an example of a waveform resulting from changing the amplitudes on antennas in a phased array of a device under test to find an interferer to signal ratio.

Another aspect of MIMO (Multiple-In Multiple Out) besides beamforming is the ability to create nulls in the direction of interfering signals by adjusting the amplitude of the channels. In the experiment, the right reference antenna was treated as the interferer. The transmit amplitude on antennas 1 and 4 was reduced. The resulting signal reduced from the reference trace to the channel 4 trace, and appears to be reduced about 6 dB, shown in FIG. 10. This would then be the signal to interferer ratio. The bottom trace 60 is a saved reference trace. As the amplitude on the antenna is reduced, the trace 62, changes from what the trace 60 was, to what 62 is in the figure. The trace 64 is connected to a reference antenna. The process does not want the trace 64 to change amplitude very much. However, the small amount of amplitude lost in 64 in the main lobe reduces the side lobe much more. This allows the determination to be made when the trace 62 reaches that amplitude of the signal to interferer ratio.

In this manner, a DUT operating in the mm wave frequency range can undergo testing without having to move the DUT for each beam. The tuning allows the DUT to remain in the same place and the phased array be tuned for each reference antenna.

Figure 11:
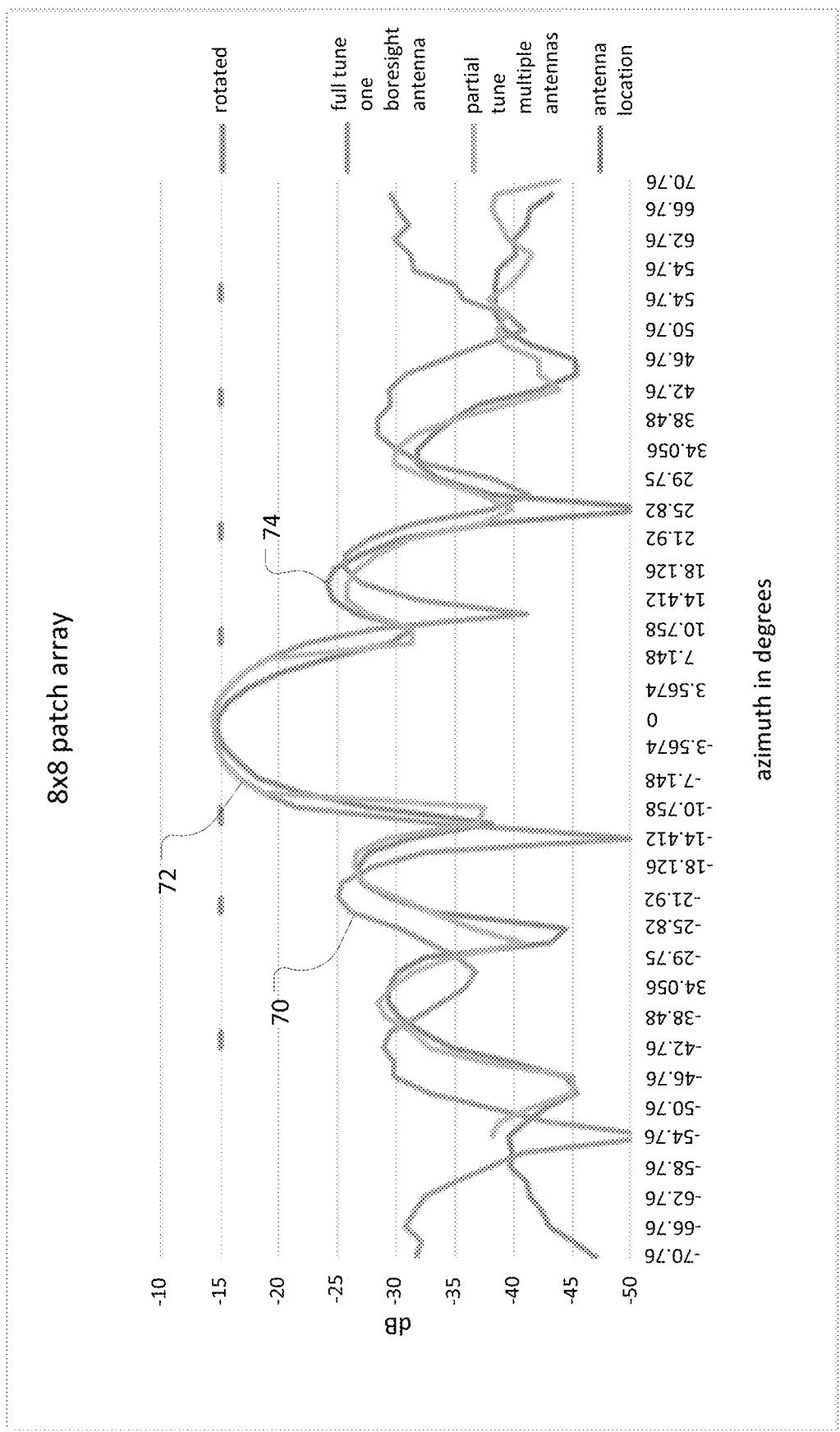
FIG. 11 shows a graph of a comparison of using current single boresight antenna to using an array of reference antennas.

FIG. 11 shows a comparison between tuning the DUT to a single antenna in curve 70, and partially tuning to multiple antennas at curve 72. Curve 74 shows the results as the DUT is rotated. This demonstrates that the technique of using multiple reference antennas, without moving the DUT, works very well.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a test and measurement system, comprising: a test and measurement device having input channels; a reference array of antennas connected to the input channels; one or more processors in the test and measurement device configured to execute code to cause the one or more processors to: receive a first signal from a phased array of antennas connected to a device under test directed at a first side of the reference array; receive a second signal from the phased array of antennas connected to the device under test directed at a second side of the reference array, without moving the device under test, the phased array, or the reference array Example 2 is the test and measurement system of Example 1, wherein the test and measurement device receives a calibration signal from the phased array at the first side of the reference array and the second side of the reference array until the received signal at each side matches the other side.

Example 3 is the test and measurement system of either of Examples 1 or 2, wherein the test and measurement device receives at a boresight antenna in the reference array until the amplitude of the calibration signal is maximized.

Example 4 is the test and measurement system of any of Examples 1 through 3, wherein the reference array does not have a boresight antenna and the device under test is configured to:
set each antenna in the phased array to zero phase; determine a center point of the reference array; and point the phased array at the center point of the array of reference antennas.

Example 5 is the test and measurement system of any of Examples 1 through 4, wherein the device under test is further configured to: reduce an amplitude of the signal on one or more of the phased array antennas until a main beam begins to decrease; and set the signal to interferer ratio equal to an amount the amplitude was reduced.

Example 6 is the test and measurement system of of Examples 1 through 5, wherein the test and measurement system further comprises a second test and measurement device connected to the device under test.

Example 7 is the test and measurement system of Example 6, wherein the second test and measurement device includes an arbitrary waveform generator.

Example 8 is the test and measurement system of any of Examples 1 through 8, wherein the phased array transmits EM signals that are one of either 5 G RF or optical signals Example 9 is a method of testing a device under test using a phased array of antennas, comprising: tuning the phased array to a first location at a first side of a reference array of antennas, by adjusting a phase for each antenna in the phased array; receiving a first signal from the device under test at the first location; tuning the phased array to a second location at a second side of the reference array of antennas; and receiving a second signal from the device under test at the second location.

Example 10 is the method of Example 9, wherein the reference array does not have a boresight antenna and the first location comprises a location of an antenna on the first side of the reference array closest to a center point of the reference array, and the second location comprises a location of an antenna on the second side of the reference array closest to the center point.

Example 11 is the method of either Example 9 or Example 10, wherein the first location comprises a location halfway between a boresight antenna and an antenna closest to the boresight antenna on the first side of the reference array, and the second location comprises a location halfway between the boresight antenna and an antenna closest to the boresight antenna on the second side of the reference array.

Example 12 is the method of any of Examples 9 through 11, further comprising: tuning each antenna in the reference array with a phase adjustment; transmitting a signal from the reference array to the phased array; and measuring the signal as it is received at the DUT.

Example 13 is the method of any of Examples 9 through 12, further comprising calibrating the phased array by: setting each antenna in the phased array to zero phase; determining a center point of the reference array, the reference array not having a boresight antenna; and pointing the phased array at the center point of the reference array.

Example 14 is the method of Example 13, wherein determining the center point of the array of reference antennas comprises: setting each antenna in the phased array to zero phase; adjusting a position of the phased array until phase and amplitude of a sinusoidal signal are the same at nearest antennas in the reference array to the center point on each side of the reference array.

Example 15 is the method of any of Examples 9 through 14, further comprising verifying the calibration by: pointing the phased array directly at a designated reference antenna during calibration; measuring the signal received at the designated reference antenna as a calibration signal; and comparing the calibration signal to the signal received at the designated antenna during testing.

Example 16 is the method of any of Examples 9 through 14, further comprising determining an optimum signal to interferer ratio for the device under test, comprising: reducing an amplitude of the signal on one or more of the phased array antennas until a main beam begins to decrease; and setting the signal to interferer ratio equal to an amount the amplitude was reduced.

Example 17 is a test and measurement device, comprising: at least two input channels; an array of at least two reference antennas, each antenna connected to one of the input channels; and one or more processors in the test and measurement device configured to execute code to cause the one or more processors to: receive an input signal from one or more of the reference antennas; and measure the input signal from one or more of the reference antennas.

Example 18 is the test and measurement device of Example 17, further comprising a display, wherein the code further causes the one or more processors to display data from one or more of the reference antennas on the display.

Example 19 is the test and measurement device of either of Example 17 or Example 18, wherein the array of reference antennas comprises a boresight antenna and an equal number of antennas on either side of the boresight antenna.

Example 20 is the test and measurement device of any of Examples 17 through Example 19, wherein the array of reference antennas comprises an equal number of antennas on either side of a center point of the array.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:
1. A test and measurement system, comprising:
a test and measurement device having input channels;
a reference array of antennas connected to the input channels, the antennas in the reference array spaced apart from each other;
one or more processors in the test and measurement device configured to execute code to cause the one or more processors to:

receive a first signal over the air from a phased array of antennas connected to a device under test directed at a first side of the reference array, the reference array and the phased array spaced apart from each other;

receive a second signal over the air from the phased array of antennas connected to the device under test directed at a second side of the reference array, without moving the device under test, the phased array, or the reference array.

2. The test and measurement system as claimed in claim 1, wherein the test and measurement device receives a calibration signal from the phased array at the first side of the reference array and the second side of the reference array until the received signal at each side matches the other side.

3. The test and measurement system as claimed in claim 1, wherein the test and measurement device receives a calibration signal at a boresight antenna in the reference array until the amplitude of the calibration signal is maximized.

4. The test and measurement system as claimed in claim 1, wherein the reference array does not have a boresight antenna and the device under test is configured to:
set each antenna in the phased array to zero phase;
determine a center point of the reference array; and
point the phased array at the center point of the reference array.

5. The test and measurement system as claimed in claim 1, wherein the device under test is further configured to:
reduce an amplitude of the signal on one or more of the phased array antennas until a main beam begins to decrease; and
set the signal to interferer ratio equal to an amount the amplitude was reduced.

6. The test and measurement system as claimed in claim 1, wherein the test and measurement system further comprises a second test and measurement device connected to the device under test.

7. The test and measurement system as claimed in claim 6, wherein the second test and measurement device includes an arbitrary waveform generator.

8. The test and measurement system as claimed in claim 1, wherein the phased array transmits electromagnetic(EM) signals that are one of 5G, RF, or optical signals.

9. A method of testing a device under test using a phased array of antennas, comprising:
tuning the phased array to a first location at a first side of a reference array of antennas, by adjusting a phase for each antenna in the phased array, the phased array spaced apart from the reference array;
receiving a first signal from the device under test over the air at the first location;
tuning the phased array to a second location at a second side of the reference array of antennas; and receiving a second signal from the device under test over the air at the second location.

10. The method as claimed in claim 9, wherein the reference array does not have a boresight antenna and the first location comprises a location of an antenna on the first side of the reference array closest to a center point of the reference array, and the second location comprises a location of an antenna on the second side of the reference array closest to the center point.

11. The method as claimed in claim 9, wherein the first location comprises a location halfway between a boresight antenna and an antenna closest to the boresight antenna on the first side of the reference array, and the second location comprises a location halfway between the boresight antenna and an antenna closest to the boresight antenna on the second side of the reference array.

12. The method as claimed in claim 9, further comprising:
tuning each antenna in the reference array with a phase adjustment;
transmitting a signal from the reference array to the phased array; and
measuring the signal as it is received at the DUT.

13. The method as claimed in claim 9, further comprising calibrating the phased array by:
setting each antenna in the phased array to zero phase;
determining a center point of the reference array, the reference array not having a boresight antenna; and
pointing the phased array at the center point of the reference array.

14. The method as claimed in claim 13, wherein determining the center point of the array of reference antennas comprises:
setting each antenna in the phased array to zero phase;
adjusting a position of the phased array until phase and amplitude of a sinusoidal signal are the same at nearest antennas in the reference array to the center point on each side of the reference array.

15. The method as claimed in claim 9, further comprising verifying the calibration by:
pointing the phased array directly at a designated reference antenna during calibration;
measuring the signal received at the designated reference antenna as a calibration signal; and
comparing the calibration signal to the signal received at the designated antenna during testing.

16. The method as claimed in claim 9, further comprising determining an optimum signal to interferer ratio for the device under test, comprising:
reducing an amplitude of the signal on one or more of the phased array antennas until a main beam begins to decrease; and
setting the signal to interferer ratio equal to an amount the amplitude was reduced.

* * * * *